United States Patent [19]
Tsai et al.

[11] Patent Number: 5,858,550
[45] Date of Patent: Jan. 12, 1999

[54] HIGH TEMPERATURE RELEASE FILMS

[75] Inventors: Mingliang Lawrence Tsai, Holmdel; Ferdinand A. DeAntonis, Flemington, both of N.J.; Alfieri Degrassi, Pottsville, Pa.

[73] Assignee: AlliedSignal Inc., Morris Twp., N.J.

[21] Appl. No.: 796,163

[22] Filed: Feb. 6, 1997

[51] Int. Cl.$^6$ ............................. B32B 27/08; B29C 47/00
[52] U.S. Cl. ................................... 428/474.4; 428/475.8; 428/476.1; 428/476.3; 428/476.9; 428/412; 428/516; 428/483; 156/244.11; 156/325; 156/326; 156/327
[58] Field of Search ................................ 428/412, 516, 428/476.9, 475.8, 483, 476.1, 476.3, 474.4; 156/244.11, 325, 326, 327

[56] References Cited

U.S. PATENT DOCUMENTS

| | | | |
|---|---|---|---|
| 4,668,571 | 5/1987 | Moriarty, Jr. | 428/327 |
| 5,002,833 | 3/1991 | Kinsey et al. | 428/475.8 |
| 5,055,355 | 10/1991 | DeAntonis | 428/476.3 |
| 5,057,372 | 10/1991 | Imfeld et al. | 428/412 |
| 5,079,052 | 1/1992 | Heyes | 428/35.3 |
| 5,080,979 | 1/1992 | Shigemoto | 428/520 |
| 5,106,692 | 4/1992 | Shigemoto | 428/412 |
| 5,227,255 | 7/1993 | Akao | 428/476.1 |

FOREIGN PATENT DOCUMENTS

| 0 688 819 | 12/1995 | European Pat. Off. . |
|---|---|---|
| 2 280 403 | 2/1995 | United Kingdom . |

*Primary Examiner*—Leszek Kiliman
*Attorney, Agent, or Firm*—Roger H. Criss

[57] ABSTRACT

Multilayered films produced by coextruding or laminating films comprised of at least one layer of polymethylpentene, at least one layer of a polyamide and an intermediate polymeric adhesive layer. The polyamide layer allows the polymethylpentene layer to be stretched up to 6 times its original length. Such a high orientation ratio for the mulitlayered film increases the mechanical strength and toughness properties of the film. The mulitlayered films are suitable for use as release films for high temperature composite applications such as printed circuit boards.

30 Claims, No Drawings

HIGH TEMPERATURE RELEASE FILMS

BACKGROUND OF THE INVENTION

1. Field of the Invention

The present invention relates to polymeric films and methods for making the same. More particularly, this invention pertains to polymethylpentene-containing films having improved mechanical, thermal and release properties when exposed to high temperatures.

2. Description of the Prior Art

It is known in the art to produce mulitlayered polymeric films containing a polymethylpentene ("PMP") layer and a thermoplastic layer. For example, U.S. Pat. No. 5,106,692 discloses a delamination resistant structure of layers of PMP and various thermoplastic resins in which a specific adhesive interlayer blend is sandwiched between the layers. The adhesive interlayer blend is a specific blend by a specified weight percent of an ethylene/alpha olefin random copolymer, a functionalized polyolefin, and a tackifier. Such patent discloses that the thermoplastic resins may be polyethylene, polypropylene, nylon, polycarbonate, ethylene/alpha-olefin copolymers, poly(4-methyl-pentene-1), polyacrylate, polymethyl methacrylate, polyvinyl chloride, polyvinylidene chloride, polystyrene, poly-p-xylene, polyesters, and polyamides.

Because of their good water barrier properties, multilayered PMP-thermoplastic films are often laminated to metal sheets for use in the manufacture of corrosion resistant cans for beverages and valve cups for aerosol containers, as in U.S. Pat. No. 5,079,052.

Mulitlayered PMP-polyolefin films are also useful as release films for various high temperature composites such as thermoset composite laminates used in the aerospace industry and printed circuit boards ("PCB"), such as in U.S. Pat. No. 5,080,979. However, because such films typically lose their dimensional stability at temperatures in excess of about 350° F. (177° C.), these films must be cured at lower temperatures for a long period of time. Other known polyolefin release films disadvantageously leave olefin residue on the PCB surface after curing.

It would be desirable to produce a PMP-containing film that retains its dimensional stability and release properties at high temperatures. It would further be desirable to reduce the production cycle time for high temperature composites by using a release film which can be cured both rapidly and without leaving a residue on the surface of the composites.

SUMMARY OF THE INVENTION

In accordance with this invention, there is provided a multilayered film comprising:

a) a first layer comprised of a polyamide homopolymer or a polyamide containing copolymer;

b) a second layer comprised of polymethylpentene homopolymer or a polymethylpentene containing copolymer; and c) an interlayer between said first and second layers comprised of a polymeric adhesive, which film is independently oriented at least about 2 times in the longitudinal and/or transverse direction.

Preferably, the film is oriented from between at least about 2 times to about 6 times in the longitudinal and/or transverse direction.

The invention also provides a method of producing an oriented, multilayered film comprising:

a) coextruding 1) a first layer comprised of a polyamide homopolymer or a polyamide containing copolymer;

2) a second layer comprised of polymethylpentene homopolymer or a polymethylpentene containing copolymer; and 3) an interlayer between said first and second layers comprised of a polymeric adhesive to form a multilayered film;

b) casting said multilayered film; and c) orienting said mulitlayered film.

The invention further provides a method of producing an oriented multilayered film comprising:

a) laminating 1) a first layer comprised of a polyamide homopolymer or a polyamide containing copolymer;

2) a second layer comprised of polymethylpentene homopolymer or a polymethylpentene containing copolymer; and 3) an interlayer between said first and second layers comprised of a polymeric adhesive to form said multilayered film; and b) orienting said multilayered film.

The film of the present invention exhibits one or more beneficial properties. Not only do the films exhibit excellent release and mechanical properties, but they also exhibit enhanced heat resistant properties and thus retain their dimensional stability at temperatures in excess of about 350° F. (177° C.). With this structure, the polyamide layer allows the PMP containing layer to be oriented in the range of at least about 2 times its original length, and up to about 6 times its original length, which thereby further improves the mechanical properties of the resulting film.

DETAILED DESCRIPTION OF THE PREFERRED EMBODIMENT

For purposes of this invention, the terms "orienting" and "stretching" shall be used interchangeably. As used herein, "copolymers" shall include polymers having two or more monomer components.

The film of the present invention may suitably comprise, consist of, or consist essentially of a layer of polyamide homopolymer or a polyamide containing copolymer; a layer of polymethylpentene homopolymer or a polymethylpentene containing copolymer; and a polymeric adhesive interlayer there between.

The polymethylpentene layer may be comprised of polmethylpentene homopolymers or copolymers or blends thereof. Of these, particularly preferred polymethylpentenes suitable to form multilayer films of the present invention include homopolymers and copolymers of 4-methyl-1-pentene, including copolymers of 4-methyl-1-pentene with another alpha-olefin. The other alpha-olefin may be an alpha-olefin having from about 2 to about 20 carbon atoms such as 1-butene, ethylene, propylene, 1-hexene, 1-octene, 1-decene, 1-tetradecane, and 1-octadecene. Preferably, the copolymer comprises, based upon the total molar weight of the copolymer, at least about 85 percent and more preferably at least about 90 percent of methylpentene units.

Preferably, the 4-methyl-1-pentene polymer has a melt flow rate (MFR5, determined under a load of 5 kg at a temperature of 260° C.) of preferably about 0.5 to about 200 g/10 minutes in order to provide good moldability and strength.

Adjacent to the polymethylpentene layer and between each film layer is an adhesive layer, also referred to in the art as a "tie" layer. Any adhesives known in the art for use with polyamides and polymethylpentene polymers are suitable for use in this invention. Illustrative of suitable adhesive polymers includes modified polyolefin compositions such as crystalline or crystallizable poly(α-olefins) and their copolymers, wherein the α-olefin monomers have between about 2 and about 6 carbon atoms. Non-limiting examples of suitable polyolefins include low, medium or high density polyethylene, linear low density polyethylene, polypropylene, polybutylene, polybutene-1, polypentene-1, poly-3-methylbutene-1, poly4-methylpentene-1, polyhexene, and copolymers and blends thereof. Of these, preferred polyolefins are polyethylene, polypropylene, polybutylene, and copolymers and blends thereof, with polyethylene being most preferred. Preferably, the interlayer consists essentially of the polymeric adhesive.

The modified polyolefins suitable for use in conjunction with the present invention include copolymers and graft copolymers of a polyolefin and a constituent having a functional moiety selected from the group consisting of unsaturated polycarboxylic acids and acid anhydrides thereof. The unsaturated polycarboxylic acids and anhydrides include maleic acid, maleic anhydride, fumaric acid, crotonic acid, citraconic anhydride, itaconic anhydride and the like. Preferred of these are anhydrides, of which the most preferred is maleic anhydride.

The preferred modified polyolefin comprises, based upon the total weight of the modified polyolefin, between about 0.001 percent and about 10 percent, preferably from about 0.005 percent to about 5 percent, and more preferably from about 0.01 percent to about 2 weight percent of a functional moiety selected from the group consisting of unsaturated polycarboxylic acids and acid anhydrides thereof.

The modified polyolefins suitable for use in this invention include compositions described in U.S. Pat. Nos. 3,481,910; 3,480,580; 4,612,155, and 4,751,270.

The modified polyolefin of the present invention can further comprise between about 0 to about 40 weight percent, based on the total weight of the modified polyolefin, of thermoplastic elastomers and alkyl esters as described in U.S. Pat. No. 5,139,878. Illustrative of suitable elastomers and alkyl esters nonexclusively include ethylene methylacrylate copolymer, ethylene butylacrylate copolymer, etc.

The modified polyolefins suitable for the present invention can be obtained from commercial sources, e.g. from Du Pont under the tradename "CXA". Alternatively, such modified polyolefins may be produced in accordance with the processes known to the art, including but not limited to the processes described in the aforementioned U.S. Pat. Nos. 3,481,910; 3,480,580; 4,612,155 and 4,751,270. In performing the graft-polymerization of unsaturated carboxylic acid and anhydride to polyolefin, there have been utilized various methods for initiating the grafting polymerization process such as γ-ray, x-ray or high-speed cathode ray irradiation processes, and a free radical initiator process. The reaction of the polyolefin with an unsaturated polycarboxylic acid or an anhydride in the presence of a free radical (e.g. a peroxide) is the most widely used method of the grafting process. The method of using peroxide is advantageous since no special equipment or device is required for initiating the graft polymerization reaction although the method suffers from non-specificity and less than optimal grafting efficiency. Examples of the peroxides employable include benzoyl peroxide, tert-butyl peroxybenzoate, cumene hydroperoxide and azo compounds, such as azo-bis (isobutyronitrile). U.S. Pat. No. 4,612,155 discloses a grafting process employing such a radical initiator that obtains the grafting yield of 50–90 percent under favorable circumstances. U.S. Pat. No. 4,751,270 discloses more specialized radical initiators that attain up to 100 percent grafting efficiency and improve grafting specificity of the functional moiety to polyolefins.

Graft polymerization reaction is generally performed by standard graft polymerization techniques known in the art, such a heating a mixture of a polyolefin, a monomer of the functional moiety and a radical initiator, after mixing those or in mixing procedure, to a temperature at which polyolefin becomes molten, under kneading of the mixture. Alternatively, the above-stated compounds are dissolved or suspended in an appropriate solvent to perform the graft polymerization reaction.

The polyamide layer is comprised of polyamides or copolymers or blends thereof. Polyamides suitable for use in this invention include aliphatic polyamides or aliphatic/aromatic polyamides. As used herein, "aliphatic polyamides" are polyamides characterized by the presence of recurring carbonamide groups as an integral part of the polymer chain which are separated from one another by at least two aliphatic carbon atoms. Illustrative of these polyamides are those having recurring monomeric units represented by the general formula:

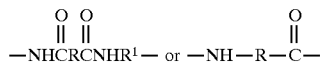

or a combination thereof in which R and $R^1$ are the same or different and are alkylene groups of at least about two carbon atoms, preferably alkylene groups having from about 2 to about 12 carbon atoms.

As used herein, an "aliphatic/aromatic polyamide" is characterized by the presence of recurring carbonamide groups as an integral part of the polymer chain where the carbonyl moieties are separated by aliphatic moieties having at least two carbon atoms and where the nitrogen groups are separated by aromatic moieties. Illustrative of the aliphatic/aromatic polyamides are those having recurring units of the formula:

in which $R^2$ and $R^3$ are different and are alkylene groups having at least 2 carbon atoms (preferably having from 2 to about 12 carbon atoms) or arylene (preferably substituted or unsubstituted phenylene, alkylenephenylene or dialkylenephenylene and wherein the aliphatic moieties have from 1 to about 7 carbon atoms wherein permissible substituents are alkyl, alkoxy or halo), with the proviso that when $R^2$ is arylene, $R^3$ is alkylene and when $R^2$ is alkylene, $R^3$ is arylene or dialkylene phenylene.

Exemplary of suitable aliphatic polyamides are polyamides formed by the reaction of diamines and diacids such as poly(hexamethylene adipamide) (nylon 6,6), poly (hexamethylene sebacamide) (nylon 6,10), poly (heptamethylene pimelamide) (nylon 7,7), poly (octamethylene suberamide) (nylon 8,8), poly (hexamethylene azelamide) (nylon 6,9), poly (nonamethylene azelamide) (nylon 9,9), poly (decamethylene azelamide) (nylon 10,9), and the like. Also illustrative of useful aliphatic polyamides are those formed by polymerization of amino acids and derivatives thereof, as for example lactams. Illustrative of these useful polyamides are poly(4-aminobutyric acid) (nylon 4), poly(6-aminohexanoic acid) (nylon 6, also known as poly(caprolactam)), poly(7-aminoheptanoic acid) (nylon 7), poly(8-aminoocatanoic acid)(nylon 8), poly(9-aminononanoic acid) (nylon 9), poly(10-aminodecanoic acid) (nylon 10), poly(11-aminoundecanoic acid) (nylon 11), poly(12-aminododecanoic acid) (nylon 12) and the like. Blends of two or more aliphatic polyamides may also be employed.

Copolymers formed from recurring units of the above referenced aliphatic polyamides can be used in the fabrication of the polyamide layer. By means of illustration and not limitation, such aliphatic polyamide copolymers include caprolactam/hexamethylene adipamide copolymer (nylon 6/6,6), hexamethylene adipamide/caprolactam copolymer (nylon 6,6/6), trimethylene adipamide/hexamethylene azelaiamide copolymer (nylon trimethyl 6,2/6,2), hexamethylene adipamide/hexamethylene-azelaiamide/caprolactam copolymer (nylon 6,6/6,9/6) and the like. Preferred aliphatic polyamides for use in the practice of this invention are poly(caprolactam) and poly(hexamethylene adipamide), with poly(caprolactam) being the most preferred.

Aliphatic polyamides used in the practice of this invention may be obtained from commercial sources or prepared in accordance with known preparatory techniques. For example, poly(caprolactam) can be obtained from Allied-Signal Inc., Morristown N.J. under the tradename "CAPRON®".

The number average molecular weight of the polyamide may widely vary. Usually, the aliphatic polyamide is of a "film-forming molecular weight", meaning a weight that is sufficiently high to form a free standing film but sufficiently low to allow melt processing of the blend into a film. Such number average molecular weights are well known to those of skill in the film forming art and are usually at least about 5,000 as determined by the formic acid viscosity method. In this method (ASTM D-789), a solution of 11 grams of aliphatic polyamide in 100 ml of 90% formic acid at 25° C. is used. In the preferred embodiments of the invention, the number average molecular weight of the aliphatic polyamide ranges between about 5,000 to about 100,000, and in the particularly preferred embodiments it ranges between about 10,000 to about 60,000. Most preferred are those in which the number average molecular weight of the aliphatic polyamide is from about 20,000 to about 40,000.

Exemplary of aliphatic/aromatic polyamides are poly (hexamethylene isophthalamide), poly (2,2,2-trimethyl hexamethylene terephthalamide), poly(m-xylylene adipamide) (MXD6), poly(p-xylylene adipamide), poly(hexamethylene terephthalamide), poly(dodecamethylene terephthalamide), and the like.

Blends of two or more aliphatic/aromatic polyamides can also be used. Preferred aliphatic/aromatic polyamides include, but are not limited to poly(hexamethylene isophthalamide), poly(2,2,2-trimethyl hexamethylene terephthalamide), poly(m-xylylene adipamide), poly(p-xylylene adipamide), poly(hexamethylene terephthalamide), and poly(dodecamethylene terephthalamide). More preferred aliphatic/aromatic polyamides are poly(2,2,2-trimethyl hexamethylene terephthalamide), poly(m-xylylene adipamide), and poly(p-xylylene adipamide), and the most preferred aliphatic/aromatic polyamide is poly(m-xylylene adipamide).

Aliphatic/aromatic polyamides can be prepared by known preparative techniques or can be obtained from commercial sources.

The number average molecular weight of the aliphatic/aromatic polyamide may vary widely. Usually, the aliphatic/aromatic polyamide is of a "film-forming molecular weight", again meaning a weight that is sufficiently high to form a free standing film and sufficiently low to allow melt processing of the blend into a film. Such number average molecular weights are well known to those of skill in the film forming art and are usually at least about 5,000 as determined by the formic acid viscosity method described above. In the preferred embodiments of the invention, the number average molecular weight of the aliphatic/aromatic polyamide is from about 5,000 to about 100,000, and in the particularly preferred embodiments is from about 10,000 to about 60,000. Most preferred are those in which the number average molecular weight of the aliphatic/aromatic polyamide is from about 20,000 to about 40,000.

Although each layer of the multilayer film structure may have a different thickness, the thickness of each polymethylpentene layer and polyamide layer in the post-stretched multilayer films structure is preferably from about 0.05 mils (1.3 μm) to about 100 mils (2540 μm), and more preferably from about 0.05 mils (1.3 μm) to about 50 mils (1270 μm). The thickness of the post-stretched adhesive layer may vary, but is generally in the range of from about 0.02 mils (0.5 μm) to about 12 mils (305 μm), preferably from about 0.05 mils (1.3 μm) to about 1.0 mils (25 μm), and most preferably from about 0.1 mils (2.5 μm) to about 0.8 mils (20 μm). While such thicknesses are preferred as providing a readily flexible film, it is to be understood that other film thicknesses may be produced to satisfy a particular need and yet fall within the scope of the present invention; such thicknesses which are contemplated include plates, thick films, and sheets which are not readily flexible at room temperature (approx. 20° C.).

The multilayer films of the present invention can have a variety of structures so long as there is an adhesive layer between each polymer layer. A typical film structure includes a three-layer structure, which comprises a polyamide layer, an adhesive polymer layer and a polymethylpentene layer. Such a structure contains, based upon the total weight of the structure, from about 1 to about 90 percent and preferably form about 2 to about 20 percent polymethylpentene, from about 1 to about 98 percent, preferably from about 5 percent to about 90 percent, and more preferably from about 50 percent to about 85 percent polyamide, and from about 1 percent to about 20 percent, and preferably from about 5 percent to about 10 percent adhesive polymer.

Another typical film structure is a five-layer structure, which comprises a polymethylpentene layer, an adhesive polymer layer, a polyamide layer, an adhesive polymer layer and a polymethylpentene layer. The weight percentages of the component layers may be as set forth for the 3 layer structure indicated above. These are only two of many possible combinations of multilayer film structures, and any variation of the order and thickness of the layers of the polymethylpentene and polyamide layer can be made.

In addition to a PMP layer, a polyamide layer, and an adhesive layer therebetween, the films may include one or more optional layers, provided that the adhesive polymer layer is positioned between the PMP layer and the polyamide layer. Illustrative of such additional optional layers are polymeric layers formed of homopolymers and copolymers formed from α, β-unsaturated monomers, such as, for example, polyolefin homopolymers such as polyethylene and polypropylene, polyvinyl alcohol, ethylene/propylene copolymer, ethylene/vinyl alcohol copolymer and blends thereof. Additional layers also include adhesive tie layers to tie various layers together.

Each layer of the multilayer film structure can contain additives which are conventionally used in such films. Examples of such additives are pigments, dyes, slip additives, fillers, nucleating agents, plasticizers, lubricants, and stabilizers and inhibitors of oxidative, thermal and ultraviolet light.

The multilayer films of this invention may be produced by conventional methods useful in producing multilayer films, including coextrusion and extrusion lamination techniques. In the most preferred method, the film is formed by coextrusion. For example, the polyamide, polymethylpentene, and adhesive polymer layers, as well as any optional layers, are fed into infeed hoppers of the extruders of like number, each extruder handling the material for one of the layers. Preferably if more than one layer of the film is comprised of the same material, then that material is extruded into its respective layers from a single extruder. For example, if both exterior layers are comprised of polymethylpentene, then the polymethylpentene is extruded into the two exterior layers from a single extruder, with the extrudate being split into the respective individual layers after it passes through both the single extruder and a feedblock co-extrusion adaptor, and then emerges from the co-extrusion die. Most preferably, three extruders are used, one being for the polyamide layer, one for the adhesive polymer layer(s), and one for the polymethylpentene layer(s).

The melted and plasticated streams from the individual extruders are fed into a single manifold co-extrusion die. While in the die, the layers are juxtaposed and combined, then emerge from the die as a single multiple layer film of polymeric material. After exiting the die, the film is cast onto a first controlled temperature casting roll, passes around the first roll, and thence onto a second controlled temperature roll, which is normally cooler than the first roll. The controlled temperature rolls largely control the rate of cooling of the film after it exits the die. In a preferred 5-layer embodiment of this invention where the two exterior layers are polymethylpentene, the center layer is polyamide, and the sandwiched layers are polyethylene modified with maleic anhydride, typical operating temperatures for the first and second controlled temperatures rolls are approximately 100° F. (38° C.) and 90° F. (32° C.).

In another method, the film forming apparatus may be one which is referred to in the art as a "blown film" apparatus and includes a multi-manifold circular die head for bubble blown film through which the plasticized film composition is forced and formed into a film "bubble". The "bubble" is ultimately collapsed and formed into a film.

Processes of coextrusion to form film and sheet laminates are generally known in the art.

One advantage of coextruded films is the formation of a multilayer film in a one process step by combining molten layers of each of the film layers of polymethylpentene, polymeric adhesive, and polyamide, as well as optionally more film layers, into a unitary film structure. In order to produce a multilayer film by a coextrusion process, it is necessary that the constituents used to form each of the individual films be compatible with the film extrusion process. The term "compatible" in this respect means that the film-forming compositions used to form the films have melt properties which are sufficiently similar so as to allow coextrusion. Melt properties of interest include, for example, melting points, melt flow indices, apparent viscosity, as well as melt stability. It is important that such compatibility be present to assure the production of a multilayer film having good adhesion and relatively uniform thickness across the width of the film being produced. As is known in the art, film-forming compositions which are not sufficiently compatible to be useful in a coextrusion process frequently produce films having poor interfacial lamination, poor physical properties as well as poor appearance.

One skilled in the art can readily weigh the above-noted compatibility in order to select polymers having desirable physical properties and determine the optimal combination of relative properties in adjacent layers without undue experimentation. If a coextrusion process is used, it is important that the constituents used to form the multilayer film be compatible within a relatively close temperature range in order to permit extrusion through a common die.

Alternatively, the multilayer films of the present invention can be produced by lamination whereby a multilayer film structure is formed from pre-fabricated film plies. The basic methods used in film laminating techniques are fusion, wet combining, and heat reactivating. Fusion, which is a method of laminating two or more film plies using heat and pressure without the use of other adhesives can only be used where the films being laminated are comprised of polymers that readily form interfacial adhesion. Wet combining and heat reactivating are utilized in laminating incompatible films using adhesive materials.

Typically, laminating is done by positioning the individual layers of the inventive film on one another under conditions of sufficient heat and pressure to cause the layers to combine into a unitary film. Typically the polymethylpentene, polymeric adhesive, and polyamide layers are positioned on one another, and the combination is passed through the nip of a pair of heated laminating rollers by techniques well known in the art such as those described in U.S. Pat. No. 3,355,347. Lamination heating may be done at temperatures ranging from about 75° C. to about 175° C., preferably from about 100° C. to about 175° C. at pressures ranging from about 5 psig (0.034 MPa) to about 100 psig (0.69 MPa) for from about 5 seconds to about 5 minutes, preferably from about 30 seconds to about 1 minute.

The multilayer film of the present invention is then stretched or oriented in any desired direction using methods well known to those skilled in the art. In such a stretching operation, the film may be stretched in either: 1) the direction coincident with the direction of movement of the film being withdrawn from the casting roll, also referred to in the art as the "machine direction"; 2) the direction which is perpendicular to the machine direction, and referred to in the art as the "transverse direction" where the resulting film is "uniaxially" oriented; or 3) the machine direction as well as in the transverse direction, where the resulting film is "biaxially" oriented. Typically for use in the present invention, the oriented film formed from the composition of the invention are preferably produced at draw ratios of from about 2:1 to about 6:1, and preferably at a draw ratio of from about 3:1 to about 4:1. The term "draw ratio" as used herein indicates the increase of dimension in the direction of the draw. Therefore, a film having a draw ratio of 2:1 has its length doubled during the drawing process. Generally, the film is drawn by passing it over a series of preheating and heating rolls. The heated film moves through a set of nip rolls downstream at a faster rate than the film entering the nip rolls at an upstream location. The change of rate is compensated for by stretching in the film.

Typical process and range of conditions for monoaxially orienting the film of the present invention are disclosed, for example, in U.S. Pat. No. 5,055,355, which is incorporated herein by reference. For example, the film may be stretched over slow and fast stretching rolls at temperatures in the range of about 100° to about 200° C. The film laminate of the present invention can be biaxially oriented using blown tube apparatus, or a tenter frame apparatus, and can either be sequentially or simultaneously oriented biaxially. The film laminate of the present invention can also be embossed after orientation.

The films of this invention can be used for any purpose for which films can be used. One noteworthy characteristic of the films of this invention is that they exhibit excellent heat resistance, dimensional stability, and release properties at temperatures in excess of 350° F. (177° C.). This feature is of particular importance in, for example, high temperature composite applications such as thermoset composite laminates in aerospace and PCB release film applications. In the latter, release films are placed on top of a coverlay on the PCB's surface and prevent the coverlay from being bonded to a platen during hot-pressing. Unlike prior art release films which leave a residue on the PCB when exposed to high temperature, the release films of the present invention permit curing of the multilayered PCB structure at significantly higher temperatures, i.e. greater than about 350° F. (177° C.), without warping or leaving a residue. Thus, the PCB production cycle time is reduced.

Another noteworthy characteristic of the films of the present invention is that they exhibit improved tensile modulus after being stretched in the machine direction and/or transverse direction and improved tensile strength after being stretched in the machine direction.

The invention illustratively disclosed herein suitably may be practiced in the absence of any element which is not specifically disclosed herein.

The following non-limiting examples serve to illustrate the invention. However, the invention should not be considered as being limited to the details thereof.

EXAMPLES

The following test procedures were used in the Examples:
Stretching: The operation of the T. M. Long laboratory film stretcher employed in all of the following examples is based on the movement of two draw bars at right angles to each other upon hydraulically driven rods. These pairs of draw bars, to which the four edges of a film specimen are attached, form the two axes at right angles to each other along which a specimen is stretched in any desired stretch ratio. Films can be stretched in one or both directions independently or in both directions simultaneously. The stretching may be done at any selected constant rate adjustable from 0.51 to 50.8 cm per second or at any constant force from zero to 11.3 kg per inch of edge before stretching. Nominal sample size before stretching is 10 cm by 10 cm between grips for stretching under 4 times original size. For stretching between 4 times and 7 times original size, the sample size is 6 cm×6 cm. Specimens may be heated in a controlled manner during the stretching cycle, similar to the commercial tenter oven. The following examples employed a constant stretch rate of 25.3 cm per second and a stretch temperature at 90°–100° C. with six seconds pre-heating at a temperature within the same range.
Tensile Modulus, Tensile Strength and Elongation: ASTM D-882. Dimensional Stability: ASTM D-1204, 350F (177 C) for 10 minutes Surface Energy: ASTM D-2578

Example 1
(Comparative): Manufacture of Oriented Poly(propylene) Films

Poly(propylene) ("PP") (melting temperature: 163° C.; melt flow rate at 230° C.: 2.8; density: 0.907 gm/cc; available from Fina Oil and Chemical Company under the tradename FINA 3378) was extruded through a 3.8 cm (1½") diameter Killion single screw extruder (L/D=24/1) equipped with three heating zones and two adaptors. The extruder temperature profiles were set at 215° C., 249° C., 249° C., for the zone 1–3 and the adaptors were maintained at 249° C. The melt temperature was 248° C.

The extrudate, after passing through a film die maintained at 260° C., was then cast onto a roller maintained at 38° C., followed by a cooling roll set at 32° C. The resultant film had a thickness of 2 mils (50 $\mu$m). Films of up to 80 mils (2000 $\mu$m) were also made. Various mechanical and physical properties of the unoriented 2 mil film are listed in Table 1.

After casting, a film of 80 mils (2000 $\mu$m) thickness was stretched off-line on the laboratory stretcher set at 148° C. After 15 seconds of preheating the cast film at 148° C., the film was sequentially stretched, at a constant stretch rate of 25.3 cm per second, five times in the machine direction and eight times in the transverse direction. The resultant film, having a thickness of 2 mils (50 $\mu$m), was then tested for various mechanical and physical properties as reported in Table 2 (under BOPP).

Example 2
(Comparative): Manufacture of Oriented Poly (methylpentene) Films

Poly(4-methyl 1-pentene) ("PMP") (melting temperature: 235° C.; melt flow index at 260° C. with 5 kg: 22; density: 0.835 gm/cc; available from Mitsui Petrochemical Industries, Ltd. under the tradename TPX MX002) was extruded according to the process set forth in Example 1 except that the extruder temperature profiles were 260° C., 288° C., 279° C. for zones 1 to 3, respectively, the adaptor temperature was maintained at 279° C., and the melt temperature was 265° C.

The extrudate, after passing through a film die maintained at 271° C., was then cast into a film according to the process set forth in Example 1. The resultant film had a thickness of 2 mils (50 $\mu$m). Other films with various thicknesses up to 10 mils (250 $\mu$m) were also made. The properties of the unoriented 2 mil film are given in Table 1. After casting, the film was stretched off-line on the laboratory stretcher set at 150° C. After 8 seconds of preheating the cast films at 150° C., several attempts were made to monoaxially stretch cast films three to five times in its original length in the machine direction at constant stretch rate of 25.3 cm/second.

As indicated in Table 2, it was not possible to monoaxially stretch the polymethylpentene (indicated as O PMP)in the machine direction in a uniform manner. That is, the resultant film did not have uniform thickness and its properties varied with thickness variations.

Example 3
(Comparative): Production of Oriented Poly(caprolactam) Films

Poly($\epsilon$-caprolactam) ("nylon 6") (melting temperature: 220° C.; relative formic acid viscosity of 73; density: 1.13 gm/cc; available from AlliedSignal under the tradename Capron® 8207F) was extruded according to the process set forth in Example 1 except that the extruder temperature profiles were 249° C., 260° C., 260° C. for Zones 1 to 3, respectively, the adaptor temperature was maintained at 260 ° C., and the melt temperature was 256° C.

The extrudate, after passing through a film die maintained at 263° C., was then cast onto a roller maintained at 38° C., followed by a cooling roll set at 32° C., The resultant film had a thickness of 2 mils (50 $\mu$m). Other films with various thicknesses up to 10 mils (250 $\mu$m) were also made. The properties of the unoriented 2 mil film are given in Table 1 (under Nylon).

After casting, the film was stretched off-line on the laboratory stretcher set at 105° C. After 8 seconds of preheating the cast film at 105° C., the film was monoaxially stretched three times in the machine direction at a constant stretch rate of 25.3 cm per second. The resultant film, having a s thickness of 1 mil (25 μm), was then tested for various mechanical and physical properties as indicated in Table 2 (under O Nylon).

Example 4

PMP/nylon 6 coextruded films

Two exterior layers of the PMP polymer of Example 2, a core layer of a nylon 6 (relative formic acid viscosity of 250; available from AlliedSignal Inc. under the tradename Capron ® XA2126), and an adhesive layer of maleic anhydride modified PP (melting temperature: 160° C.; melt flow rate at 230° C.: 3.0; density: 0.90 gm/cc; available from Mitsui Petrochemical Industries, Ltd. under the tradename Admer ® QF500A) between the core layer and each exterior layer were coextruded into a five layer film.

The nylon 6 and PMP layers were extruded according to the process set forth in Examples 2 and 3, respectively. The adhesive layers were extruded through a 3.2 cm (1¼") diameter Killion single screw extruder (L/D=30/1) equipped with four heating zones and two adaptors. The extruder temperature profiles were set at 238° C., 249° C., 260° C., 260° C. for the zone 1–4 and the adaptors were maintained at 260° C. The melt temperature was 258° C.

The five layer extrudate, after passing through a coextrusion film die maintained at 271° C., was then cast onto a roller maintained at 38° C., followed by a cooling roll set at 32° C. The resultant film had a thickness of 2 mils (50 μm). Other films with various thicknesses up to 10 mils (250 μm) were also made. The physical properties of the 2 mil film are indicated in Table 1 (under PMP/N6).

After casting, the film was stretched off-line on the laboratory stretcher set at 115° C. After 8 seconds of preheating the cast films at 115° C., the film was monoaxially stretched three times in the machine direction at a constant stretch rate of 25.3 cm/second. The resultant film, having a thickness of 1 mil (25 μm), was then tested for various mechanical and physical properties as indicated in Table 2 (under O PMP/N6).

TABLE 1

Properties Comparison of Cast, Unoriented Films

|  | Ex. 1 PP | Ex. 2 PMP | Ex.3 Nylon | Ex.4 PMP/N6 |
|---|---|---|---|---|
| Thickness, mil (μm) | 2 (50) | 2 (50) | 2 (50) | 2 (50) |
| Tensile Strength, kpsi; (MPa) | | | | |
| MD | 5 (34.5) | 6.1 (42.1) | 18 (124) | 16 (110) |
| TD | 3 (20.7) | 3.3 (22.8) | 18 (124) | 14 (96.5) |
| Modulus, kpsi; (MPa) | | | | |
| MD | 110 (758) | 97 (669) | 110 (758) | 101 (696) |
| TD | 115 (793) | 102 (703) | 130 (896) | 85 (586) |
| Elongation, (%) | | | | |
| MD | 400 | 157 | 365 | 403 |
| TD | 400 | 407 | 372 | 384 |
| Dimensional Stability, (%, 10 min at 350° F. (177° C.)) | | | | |
| MD | N/A* | −1 | −1 | +1.5 |

TABLE 1-continued

Properties Comparison of Cast, Unoriented Films

|  | Ex. 1 PP | Ex. 2 PMP | Ex.3 Nylon | Ex.4 PMP/N6 |
|---|---|---|---|---|
| TD | N/A* | −2 | −1 | −0.5 |
| Surface Energy (dyne/cm) | 30 | 24 | 41 | 24 |

Note:
* - PP film was seriously distorted after 10 minutes at 350° F. (177° C.).

TABLE 2

Properties Comparison of Oriented Films

|  | Ex. 1 BOPP* | Ex. 2 O PMP** | Ex. 3 O Nylon | Ex. 4 O PMP/N6 |
|---|---|---|---|---|
| Thickness, mil; (μm) | 2 (50) | — | 1 (25) | 1 (25) |
| Tensile Strength, kpsi; (MPa) | | | | |
| MD | 15.8 (109) | — | 48 (331) | 43 (296) |
| TD | 42.3 (292) | — | 12 (82.7) | 13 (89.6) |
| Modulus, kpsi; (MPa) | | | | |
| MD | 338 (2331) | — | 400 (2758) | 350 (2413) |
| TD | 715 (4930) | — | 370 (2551) | 300 (2069) |
| Elongation, (%) | | | | |
| MD | 175 | — | 60 | 57 |
| TD | 36 | — | 340 | 345 |
| Dimensional Stability, (%, 10 min at 350° F. (177° C.)) | | | | |
| MD | −49 | — | −20 | −20 |
| TD | −79 | — | −0.3 | −1 |
| Surface Energy (dyne/cm) | 30 | — | 41 | 24 |

Note:
*All films were monoaxially oriented in the machine direction, except the PP film was biaxially oriented.
** - PMP film could not be uniformly oriented.

It is readily apparent from Table 2 that the coextruded, oriented PMP/nylon films retain their superior surface energy properties and approximately triple their tensile strength in the machine direction and their modulus properties relative to the unoriented PMP/nylon film. Moreover, the films retain their superior dimensional stability. It can be seen that the PMP/nylon film has excellent dimensional stability in the TD. Improvements of the dimensional stability in the MD can be achieved by orienting in-line with casting, followed by an annealing step.

It can be seen that this invention provides an oriented multilayered PMP film that retains its dimensional stability and release properties, and has excellent mechanical strength.

What is claimed is:

1. A multilayered film comprising:
   a) a first layer comprised of a polyamide homopolymer or a polyamide containing copolymer;
   b) a second layer comprised of polymethylpentene homopolymer or a polymethylpentene containing copolymer; and c) an interlayer between a surface of said first layer and said second layer comprised of a polymeric adhesive, which film is independently oriented at least about 2 times in the longitudinal and/or transverse direction.

2. The film of claim 1 in which said polymeric adhesive is a functionalized polyolefin having at least one functional moiety of an unsaturated carboxylic acid or anhydride thereof.

3. The film of claim 2 in which said polymeric adhesive is a polyolefin selected from the group consisting of low, medium or high density polyethylene, linear low density polyethylene, polypropylene, polybutylene, polybutene-1, polypentene-1, poly-3-methylbutene-1, poly-4-methylpentene-1, polyhexene, and copolymers and blends thereof.

4. The film of claim 2 wherein said polymeric adhesive contains, based upon the total weight of the functionalized polyolefin, from about 0.001% to about 10% of said functional moiety.

5. The film of claim 2 wherein said functional moiety is selected from the group consisting of maleic acid, maleic anhydride, fumaric acid, crotonic acid, citraconic anhydride, itaconic anhydride and mixtures thereof.

6. The film of claim 2 wherein said moiety is maleic anhydride.

7. The film of claim 1 further comprising a second layer of a polymethylpentene homopolymer or a polymethylpentene containing copolymer attached to another surface of said polyamide layer by a second polymeric adhesive layer therebetween.

8. The film of claim 1 wherein said interlayer consists essentially of a polymeric adhesive.

9. The multilayer film of claim 1 wherein the polyamide is selected from the group consisting of an aliphatic polyamide, an aliphatic/aromatic polyamide, and mixtures and copolymers thereof.

10. A film according to claim 1 wherein said polyamide is selected from the group consisting of poly(caprolactam), poly(hexamethylene adipamide) and mixtures and copolymers thereof.

11. A film according to claim 1 wherein said polyamide is a poly(caprolactam) homopolymer or copolymer.

12. A film according to claim 1 wherein said polymethylpentene is a homopolymer of 4-methylpentene-1 or a copolymer of 4-methylpentene-1 with an alpha olefin.

13. A film according to claim 12 wherein said alpha olefin is selected from the group consisting of ethylene, propylene, 1-butene, 1-pentene, 1-hexane, and 4-methyl-1-pentene.

14. A film according to claim 12 wherein said polymethylpentene is a copolymer which comprises, based upon the total molar weight of the copolymer, at least about 85 percent of methylpentene units.

15. The film of claim 1 which has been uniaxially stretched in its longitudinal direction or its transverse direction.

16. The film of claim 1 which film has been biaxially stretched in its longitudinal and its transverse direction.

17. The film of claim 1 which has been independently stretched from about 2 times to about 6 times in its longitudinal and/or transverse direction.

18. An article of manufacture comprised of at least one layer of the film of claim 1.

19. A release film comprised of at least one layer of the film of claim 1.

20. A method of producing a multilayeredilm comprising:
a) coextruding
1) a first layer comprised of a polyamide homopolymer or a polyamide containing copolymer;
2) a second layer comprised of polymethylpentene homopolymer or a polymethylpentene containing copolymer; and
3) an interlayer between a surface of said first layer and said second layer, said interlayer comprised of a polymeric adhesive to form a multilayered film;
b) casting said multilayered film; and
c) orienting said mulitlayered film.

21. The process of claim 20, wherein said mulitlayered film is oriented in a uniaxial direction.

22. The process of claim 20 wherein said multilayered film is oriented in a biaxial direction.

23. The method of claim 21 further comprising coextruding and attaching a second layer of a polymethylpentene homopolymer or a polymethylpentene containing copolymer to another surface of said layer of a polyamide homopolymer or polyamide containing copolymer by a second polymeric adhesive layer sandwiched therebetween.

24. The method of claim 20 wherein said polymeric adhesive layer is comprised of a polyolefin having at least one functional moiety of an unsaturated carboxylic acid or anhydride thereof.

25. The method of claim 24 wherein the polyolefin layer is selected from the group consisting of poly(propylene), poly(ethylene), poly(butylene), copolymers containing a polyolefin and mixtures thereof.

26. The method of claim 25 wherein said unsaturated carboxylic acid anhydride is maleic anhydride.

27. The method of claim 21 wherein the polyamide is selected from from the group consisting of poly (caprolactam), poly(hexamethylene adipamide) and mixtures and copolymers thereof.

28. The method of claim 20 wherein said polyamide is a poly(caprolactam) homopolymer or copolymer.

29. The method of claim 20 wherein the film is oriented from about 2 times to about 6 times in its longitudinal and/or transverse direction.

30. A method of producing a multilayeredilm comprising:
a) laminating
1) a first layer comprised of a polyamide homopolymer or a polyamide containing copolymer;
2) a second layer comprised of polymethylpentene homopolymer or a polymethylpentene containing copolymer; and
3) an interlayer between said first and second layers comprised of a polymeric adhesive to form said multilayered film; and
b) orienting said multilayered film.

* * * * *